(12) United States Patent
Fujimoto

(10) Patent No.: US 7,922,399 B2
(45) Date of Patent: Apr. 12, 2011

(54) SEMICONDUCTOR APPARATUS WITH SEMICONDUCTOR DEVICES AND COOLING HEAT SINKS

(75) Inventor: Takafumi Fujimoto, Tokyo (JP)

(73) Assignee: Toshiba Mitsubishi-Electric Industrial Systems Corporation, Tokyo (JP)

( * ) Notice: Subject to any disclaimer, the term of this patent is extended or adjusted under 35 U.S.C. 154(b) by 500 days.

(21) Appl. No.: 11/232,015

(22) Filed: Sep. 22, 2005

(65) Prior Publication Data

US 2006/0214180 A1 Sep. 28, 2006

(30) Foreign Application Priority Data

Mar. 23, 2005 (JP) ................................. 2005-084255

(51) Int. Cl.
*G02B 6/36* (2006.01)
*H01L 29/24* (2006.01)
*H01L 21/00* (2006.01)

(52) U.S. Cl. ................ 385/92; 385/14; 385/31; 385/49; 385/88; 385/89; 257/100; 257/117; 438/57

(58) Field of Classification Search .................. 257/712, 257/E31.131, 116, 117, 21, 257, 433, 100; 385/5, 14, 27, 31, 38, 39, 49, 88, 89, 92, 385/94; 438/57

See application file for complete search history.

(56) References Cited

U.S. PATENT DOCUMENTS

| 4,186,409 | A | * | 1/1980 | McMullin | 257/117 |
| 4,301,462 | A | * | 11/1981 | Lowry | 257/117 |
| 4,368,481 | A | * | 1/1983 | Ohashi et al. | 257/116 |
| 4,386,362 | A | * | 5/1983 | Kessler et al. | 257/715 |
| 5,424,573 | A | * | 6/1995 | Kato et al. | 257/431 |
| 2006/0214180 | A1 | * | 9/2006 | Fujimoto | 257/100 |

FOREIGN PATENT DOCUMENTS

EP 200021 A1 * 11/1986
JP 57035357 A * 2/1982

OTHER PUBLICATIONS

Translation of Yoshinaka et al., JP 57035357 A.*
Machine translation of Schellenberg et al., (EP 200021 A1).*

* cited by examiner

*Primary Examiner* — Brian M Healy
(74) *Attorney, Agent, or Firm* — Finnegan, Henderson, Farabow, Garrett & Dunner, L.L.P.

(57) ABSTRACT

In a semiconductor apparatus, a plurality of light-triggered type semiconductor devices, each having a groove for burying of an optical fiber for supplying an optical gate signal to a housing of the light-triggered type semiconductor device, are connected in series. Device cooling heat sinks, each having a flow path for circulating a coolant medium and a coolant inlet and a coolant outlet communicating with the flow path, are disposed on both sides of the housing of each light-triggered type semiconductor device. The light-triggered type semiconductor devices and the device cooling heat sinks are coupled into a single structure. An optical fiber insertion groove, which corresponds in position to the groove of the housing, is provided on a side surface of the device cooling heat sink, which contacts a groove (4)-side surface of the housing of the light-triggered type semiconductor device.

3 Claims, 5 Drawing Sheets

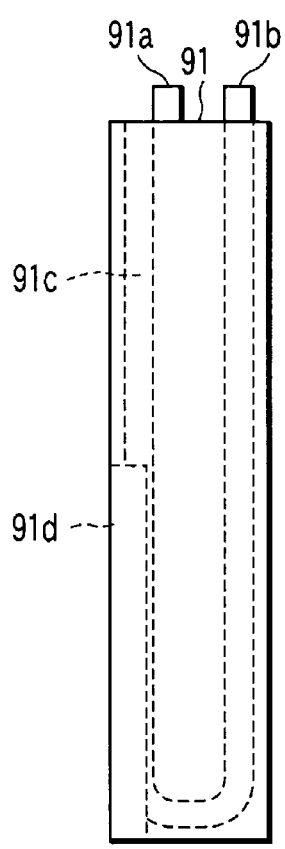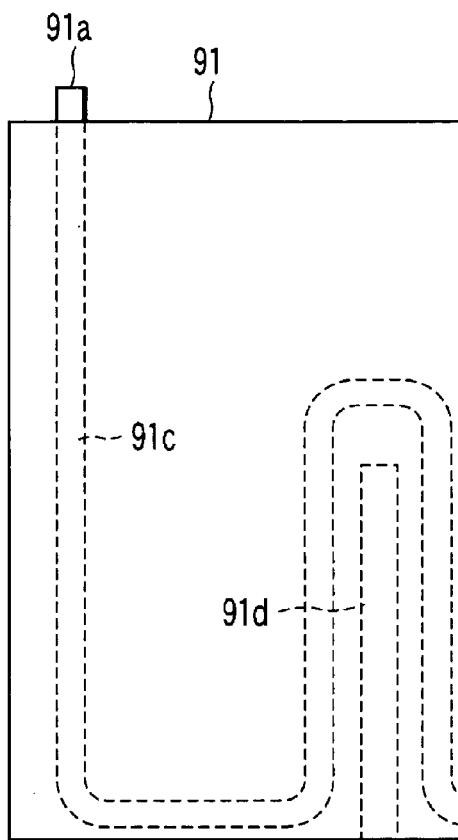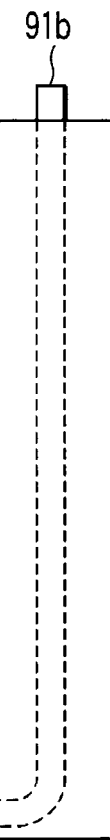
FIG. 9A     FIG. 9B
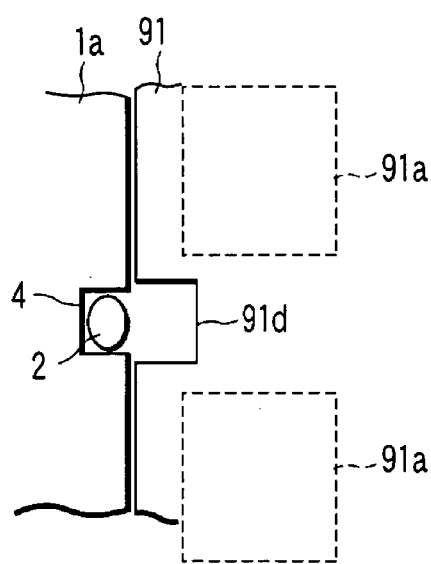
FIG. 10

SEMICONDUCTOR APPARATUS WITH SEMICONDUCTOR DEVICES AND COOLING HEAT SINKS

CROSS-REFERENCE TO RELATED APPLICATIONS

This application is based upon and claims the benefit of priority from prior Japanese Patent Application No. 2005-084255, filed Mar. 23, 2005, the entire contents of which are incorporated herein by reference.

BACKGROUND OF THE INVENTION

1. Field of the Invention

The present invention relates to a semiconductor apparatus that is configured such that device cooling heat sinks are disposed on both sides of a light-triggered type semiconductor device to thereby cool the light-triggered type semiconductor device, and to a method of assembling the semiconductor apparatus.

2. Description of the Related Art

In a conventional semiconductor apparatus using light-triggered type semiconductor devices, as shown in FIG. 1, an n-number of light-triggered type semiconductor devices 11 to 1n are connected in series. Optical gate signals 101 to 10n are generated from a gate signal generating device 3 and supplied to the light-triggered type semiconductor devices 11 to 1n through optical fibers 21 to 2n.

Each of the light-triggered type semiconductor devices 11 to 1n is configured as shown in FIG. 2A and FIG. 2B. Specifically, the light-triggered type semiconductor device 1, as shown in FIGS. 2A and 2B, has a circular housing 1a. A circular silicon wafer 5 is concentrically disposed within the housing 1a. An L-shaped groove 4 is formed on an upper surface of the housing 1a. The L-shaped groove 4 extends radially outward from the center of the upper surface of the housing 1a, and also the L-shaped groove 4 extends from the center of the upper surface of the housing 1a toward the center of the silicon wafer 5. In addition, a cooling fin 1b is provided on an outer peripheral portion of the lower part of the housing 1a.

An optical fiber 2 for guiding the optical gate signal 10 to the silicon wafer 5 is buried in the L-shaped groove 4 that is formed in the housing 1a.

The optical fiber 2, as shown in FIG. 3, comprises a metal pipe portion 6 that corresponds in shape to the L-shaped groove 4 that is formed in the housing 1a; an insulating sheath portion 7 that is connected to the metal pipe portion 6 via a coupler and secures insulation between a high voltage part and a low-voltage part; and an optical fiber portion 8 that is passed through the metal pipe portion 6 and insulating sheath portion 7 and transmits the optical gate signal.

FIG. 4 shows the state in which the metal pipe portion 6 of the optical fiber 2 is buried in the L-shaped groove 4 that is formed in the housing 1a of the light-triggered type semiconductor device 1 shown in FIG. 2A and FIG. 2B.

Thus, if an optical gate signal is generated from the gate signal generating device 3, the optical gate signal is sent to the silicon wafer 5 within the housing 1a through the optical fiber portion 8.

The above-described light-triggered type semiconductor device 1 and optical fiber 2 constitute one device unit. In the case where the n-number of light-triggered type semiconductor devices 11 to 1n are connected in series, as shown in FIG. 1, device cooling heat sinks 9 are disposed so as to sandwich both side surfaces of each light-triggered type semiconductor device, 11 to 11a, as shown in FIG. 5, and the heat sinks 9 and semiconductor devices 11 to 11a are coupled into an integral structure. In this case, as shown in FIG. 6, the optical fiber (2)-side surface of the light-triggered type semiconductor device 1 is put in close contact with the side surface of the associated device cooling heat sink 9.

The device cooling heat sink 9 includes a water inlet 9a and a water outlet 9b for supplying and draining cooling water, which are provided at one end face of the heat sink 9, and a flow path 9c through which the cooling water is circulated to cool the heat that is produced from each device.

As has been described above, in the conventional semiconductor apparatus, the optical fiber 2 is first buried in the groove 4 that is formed in the housing of each light-triggered type semiconductor device 1, following which the heat sinks 9 are disposed so as to sandwich both side surfaces of the light-triggered type semiconductor device 1. Consequently, when the semiconductor devices and heat sinks are coupled into the integral structure, the work for coupling has to be conducted in the state in which the optical fibers 2 are led out of the light-triggered type semiconductor devices 1. Thus, there is the problem that the work for coupling is difficult.

In addition, if the optical fiber 2 is damaged and a need for replacement of the optical fiber 2 arises after the light-triggered type semiconductor devices 1 and heat sinks 9 are coupled into the integral structure, the integral structure has to be disassembled. The work for this requires a great deal of time and labor.

BRIEF SUMMARY OF THE INVENTION

The present invention has been made in order to solve the above problems, and the object of the invention is to provide a semiconductor apparatus and a method of assembling the semiconductor apparatus, which can facilitate the work for coupling light-triggered type semiconductor devices and heat sinks and can also facilitate replacement of optical fibers.

In order to achieve the above object, the present invention has the following structures.

(1) There is provided a semiconductor apparatus in which a plurality of light-triggered type semiconductor devices, each having a groove for burying of an optical fiber for supplying an optical gate signal to a housing of the light-triggered type semiconductor device, are connected in series, and device cooling heat sinks, each having a flow path for circulating a coolant medium and a coolant inlet and a coolant outlet communicating with the flow path, are disposed on both sides of the housing of each light-triggered type semiconductor device, the light-triggered type semiconductor devices and the device cooling heat sinks being coupled into a single structure, wherein an optical fiber insertion groove, which corresponds in position to the groove of the housing, is provided on a side surface of the device cooling heat sink, which contacts a groove-side surface of the housing of the light-triggered type semiconductor device.

(2) In the semiconductor apparatus according to the above item 1, the coolant flow path that is formed within the device cooling heat sink is provided along a surrounding part of the optical fiber insertion groove.

(3) There is provided a method of assembling a semiconductor apparatus, comprising: connecting in series a plurality of light-triggered type semiconductor devices, each having a groove for burying of an optical fiber for supplying an optical gate signal to a housing of the light-triggered type semiconductor device; disposing device cooling heat sinks, each having a flow path for circulating a coolant medium and a coolant inlet and a coolant outlet communicating with the flow path, on both sides of the housing of each light-triggered type semiconductor device; coupling the light-triggered type semiconductor devices and the device cooling heat sinks into a single structure; and burying and attaching, thereafter, the optical fiber in the groove formed in the housing, while inserting the optical fiber through an optical fiber insertion groove, the optical fiber insertion groove, which corresponds in position to the groove of the housing, being provided on a contact surface of the device cooling heat sink, which contacts a groove-side surface of the housing of the light-triggered type semiconductor device.

According to the present invention, optical fibers can be attached to light-triggered type semiconductor devices after the light-triggered type semiconductor devices and device cooling heat sinks are coupled into a single structure. Thus, the work efficiency is enhanced, and even if the optical fiber is damaged, it can easily be replaced.

Moreover, the flow path for circulating a coolant within the heat sink is provided along the surrounding part of the optical fiber insertion groove. Thereby, the efficiency of cooling the light-triggered type semiconductor device can be improved.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 9A is a front view of a device cooling heat sink in a second embodiment of the semiconductor apparatus according to the present invention, and FIG. 9B is a plan view of the device cooling heat sink in the second embodiment of the semiconductor apparatus according to the invention; and FIG. 10 is a cross-sectional view that shows a contact part between the device cooling heat sink and the light-triggered type semiconductor device in the second embodiment.

DETAILED DESCRIPTION OF THE INVENTION

Figure 1:
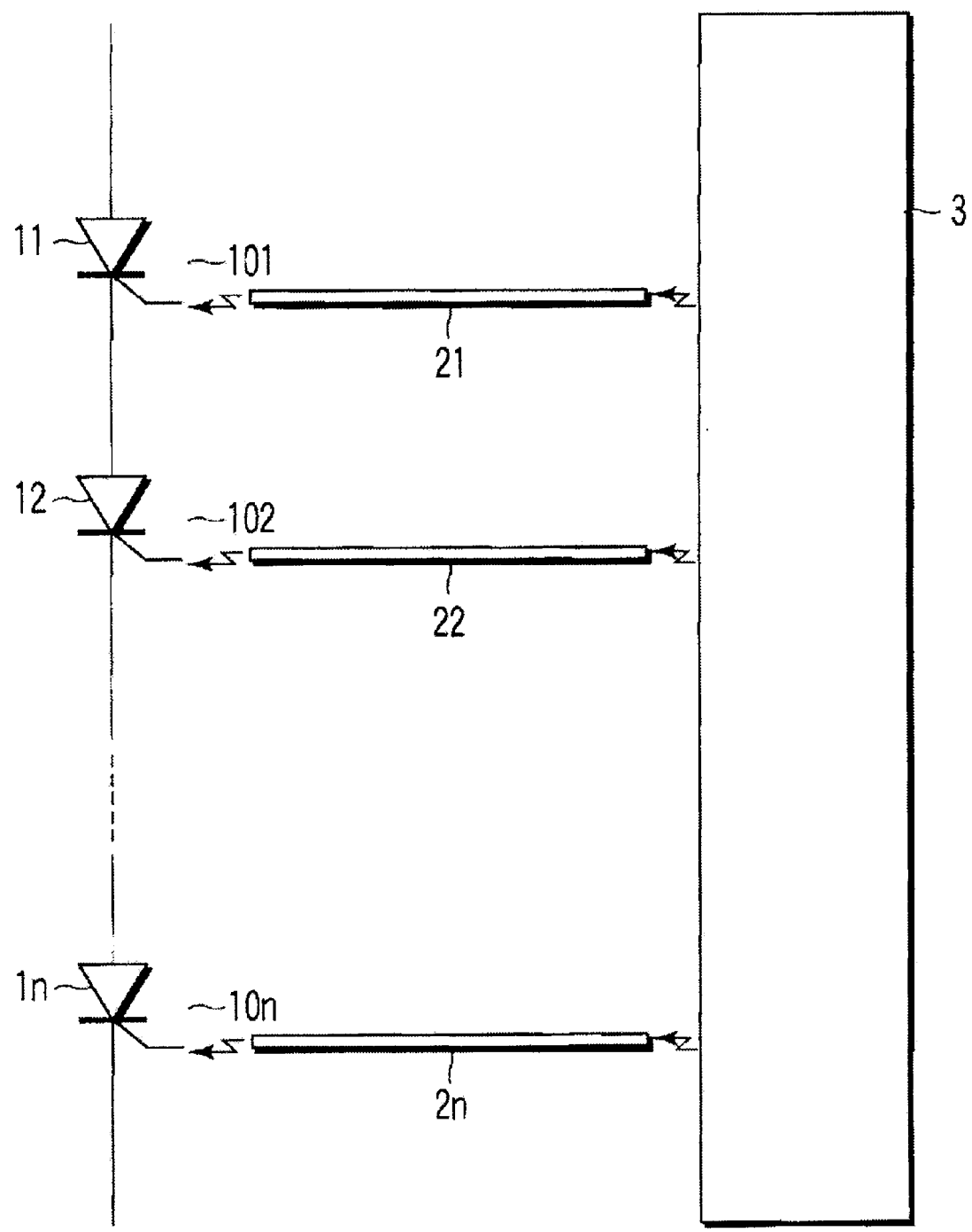
FIG. 1 shows the structure of a 1-phase part of a conventional semiconductor apparatus.
Figure 2A:
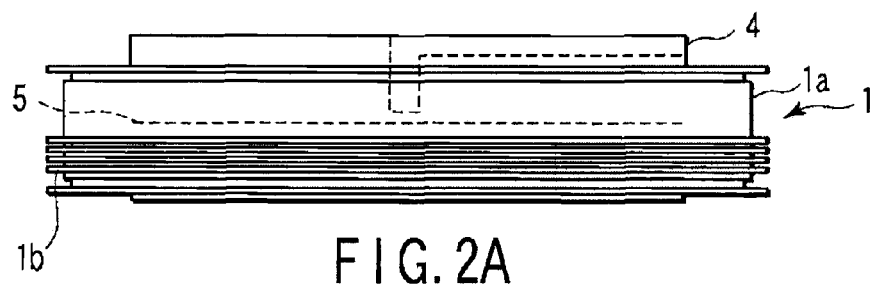
FIG. 2A is a front view of a light-triggered type semiconductor device.
Figure 2B:
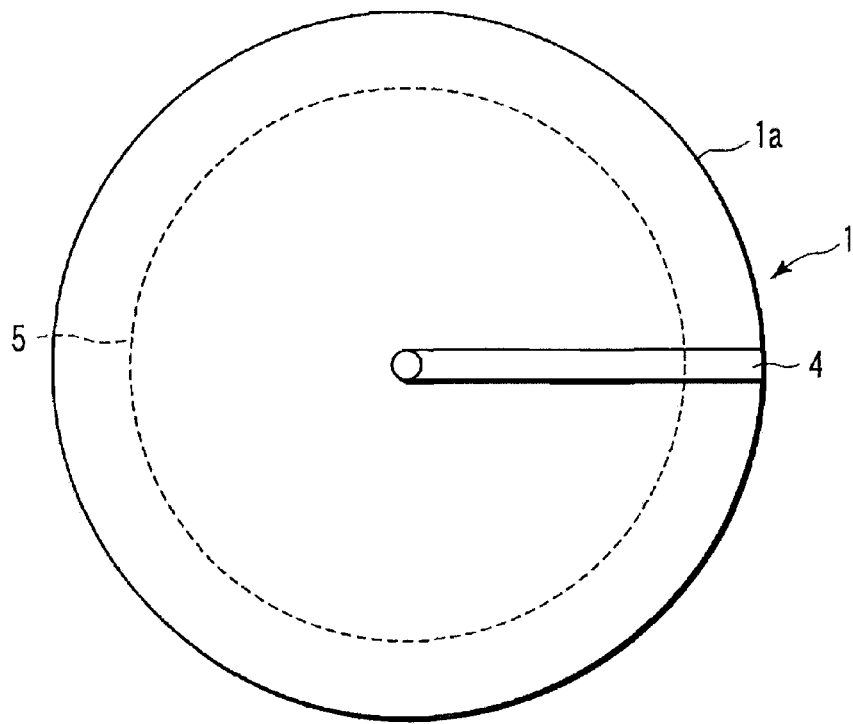
FIG. 2B is a plan view of the light-triggered type semiconductor device.
Figure 3:
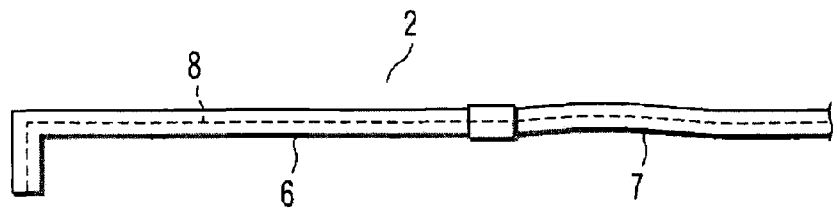
FIG. 3 shows the structure of an optical fiber that is attached to the light-triggered type semiconductor device.
Figure 4:
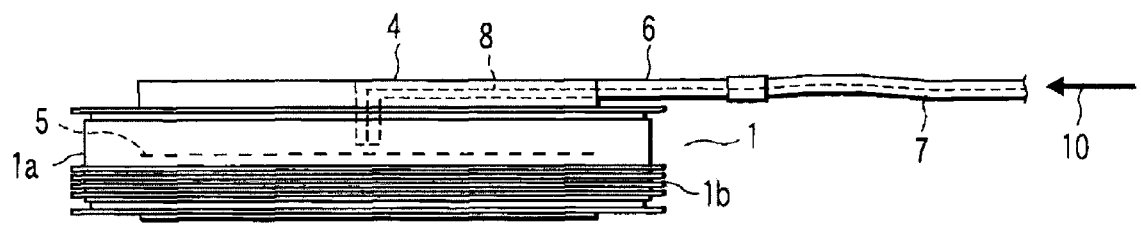
FIG. 4 is a front view that shows the state in which the optical fiber is attached to the light-triggered type semiconductor device.

Embodiments of the present invention will now be described with reference to the accompanying drawings. Structural parts that are common to those shown in FIG. 1 to FIG. 6 are denoted by like reference numerals, and a description thereof is omitted.

Figures 7A, 7B:
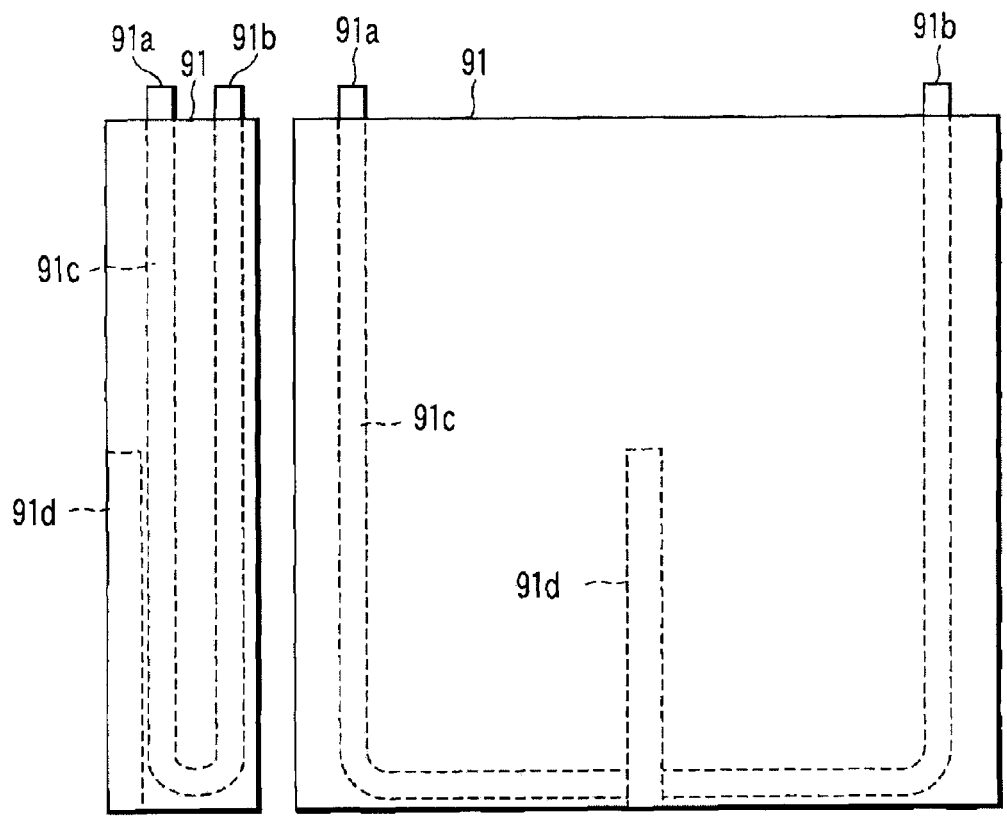
FIG. 7A is a front view of a device cooling heat sink in a first embodiment of the semiconductor apparatus according to the present invention.
FIG. 7B is a plan view of the device cooling heat sink in the first embodiment of the semiconductor apparatus according to the invention.
Figure 6:
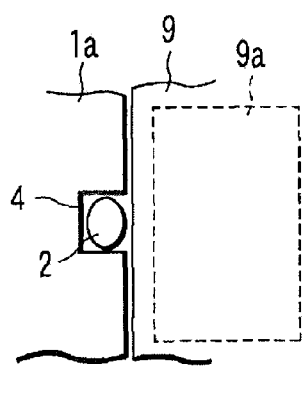
FIG. 6 is a cross-sectional view taken along line A-A' in FIG. 5.

FIG. 7A is a front view of a device cooling heat sink in a first embodiment of the semiconductor apparatus according to the present invention. FIG. 7B is a plan view of the device cooling heat sink in the first embodiment of the semiconductor apparatus according to the invention.

Figure 5:
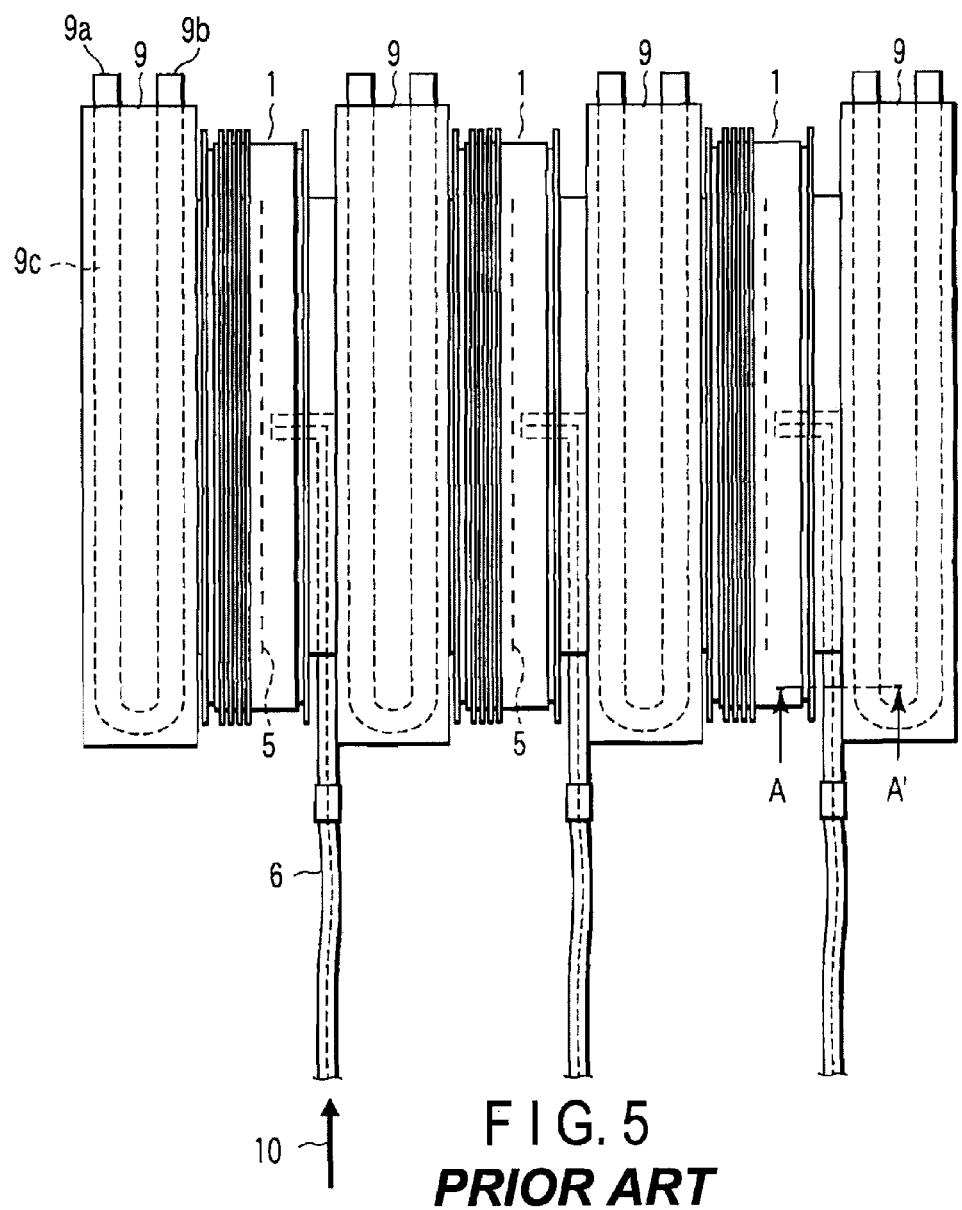
FIG. 5 shows a single structure in which light-triggered type semiconductor devices and device cooling heat sinks are coupled.
Figure 8:
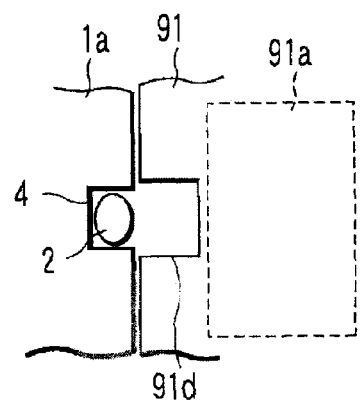
FIG. 8 is a cross-sectional view that shows a contact part between the device cooling heat sink and the light-triggered type semiconductor device in the first embodiment.

FIG. 8 is a cross-sectional view, which corresponds to a cross section taken along line A-A' in FIG. 5, and shows a contact part between the device cooling heat sink and the light-triggered type semiconductor device in the first embodiment.

In the first embodiment, as shown in FIG. 7A, FIG. 7B and FIG. 8, an optical fiber insertion groove 91*d*, which corresponds in position to a groove 4 of a housing 1*a*, is formed on that side surface of a device cooling heat sink 91, which contacts a groove (4)-side surface of the housing 1*a* of the light-triggered type semiconductor device 1.

In this case, the device cooling heat sink 91 has a greater wall thickness than the device cooling heat sink 9 shown in FIG. 5. The device cooling heat sink 91 includes a water inlet 91*a* and a water outlet 91*b* for supplying and draining cooling water, which are provided at one end face of the heat sink 91, and a flow path 91*c* through which the cooling water is circulated to cool the heat that is produced from each device. Thus, the groove 91*d* of a size enough to insert the optical fiber 4 can be formed in the thick wall part of the device cooling heat sink 91, without the groove 91*d* intersecting the flow path 91*c*.

In the state in which the optical fiber 4 is not attached, the device cooling heat sinks 91 are disposed to sandwich both side surfaces of the housing 1*a* of each light-triggered type semiconductor device 1, like the structure shown in FIG. 5. The heat sinks 91 and semiconductor devices 1 are thus coupled into a single integral structure. In this case, the side surface of the housing 1*a* is put in close contact with the side surface of the associated device cooling heat sink 91, and the optical fiber insertion groove 91*d* is formed at a position corresponding to the groove 4 of the housing 1*a*. The optical fiber insertion groove 91*d* is formed such that the optical fiber 2 (shown in FIG. 3) having the metal pipe portion 6, which corresponds in shape to the L-shaped groove 4 of the housing 1*a*, can be inserted in a hole that is defined by the optical fiber insertion groove 91*d* and the groove 4 formed in the side surface of the housing 1*a* of the light-triggered type semiconductor device 1.

Subsequently, the optical fiber 2 is inserted through the optical fiber insertion groove 91*d*, and the optical fiber 2 is buried in the groove 4 formed in the side surface of the housing 1*a* of the light-triggered type semiconductor device 1. Thereby, the optical fiber 2 is attached to the light-triggered type semiconductor device 1.

As has been described above, according to the first embodiment of the invention, the optical fiber insertion groove 91*d*, which corresponds in position to the groove 4 of the housing 1*a*, is formed in that side surface of the device cooling heat sink 91, which contacts the groove (4)-side surface of the housing 1*a* of the light-triggered type semiconductor device 1. Thereby, after the light-triggered type semiconductor devices 1 and device cooling heat sinks 91 are coupled into the single structure, the optical fibers 2 can be attached to the light-triggered type semiconductor devices 1 through the optical fiber insertion grooves 91d.

When the heat sinks 91 are disposed to sandwich both side surfaces of the housing 1a of each light-triggered type semiconductor device 1 and the heat sinks 91 and light-triggered type semiconductor devices 1 are coupled into the single structure, the optical fiber 2 is yet to be attached. Therefore, the work efficiency is enhanced, and even if the optical fiber 2 is damaged, it can easily be replaced.

FIG. 9A is a front view of a device cooling heat sink in a second embodiment of the semiconductor apparatus according to the present invention. FIG. 9B is a plan view of the device cooling heat sink in the second embodiment of the semiconductor apparatus according to the invention.

FIG. 10 is a cross-sectional view, which corresponds to a cross section taken along line A-A' in FIG. 5, and shows a contact part between the device cooling heat sink and the light-triggered type semiconductor device in the second embodiment.

In the second embodiment, as shown in FIG. 9A, FIG. 9B and FIG. 10, an optical fiber insertion groove 91d, which corresponds in position to the groove 4 of the housing 1a, is formed on that side surface of the device cooling heat sink 91, which contacts the groove (4)-side surface of the housing 1a of the light-triggered type semiconductor device 1. In addition, a flow path 91c is provided within the device cooling heat sink 91 in a curved shape along the surrounding part of the optical fiber insertion groove 91d.

With this structure of the device cooling heat sink 91, like the first embodiment, after the light-triggered type semiconductor devices 1 and device cooling heat sinks 91 are coupled into the single structure, the optical fibers 2 can be attached to the light-triggered type semiconductor devices 1 through the optical fiber insertion grooves 91d.

When the heat sinks 91 are disposed to sandwich both side surfaces of the housing 1a of each light-triggered type semiconductor device 1 and the heat sinks 91 and light-triggered type semiconductor devices 1 are coupled into the single structure, the optical fiber 2 is yet to be attached. Therefore, the work efficiency is enhanced, and even if the optical fiber 2 is damaged, it can easily be replaced.

Furthermore, the flow path 91c, which is formed within the device cooling heat sink 91, is provided along the surrounding part of the optical fiber insertion groove 91d. Thus, the coolant can be circulated in the vicinity of the contact surface between the light-triggered type semiconductor device 1 and the associated device cooling heat sink 91. Therefore, the efficiency of cooling the light-triggered type semiconductor device 1 can be improved.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor apparatus, comprising:
    a plurality of light-triggered type semiconductor devices, each light-triggered type semiconductor device having:
        a housing, and
        a groove provided on the housing for burying an optical fiber that supplies an optical gate signal into the housing, the optical fiber being provided in an L-shaped metal pipe; and
    a plurality of device cooling heat sinks, each device cooling heat sink having a thick wall part,
    wherein the plurality of light-triggered type semiconductor devices are connected in series,
    wherein each device cooling heat sink has a flow path for circulating a coolant medium, a coolant inlet, and a coolant outlet communicating with the flow path,
    wherein each device cooling heat sink is connected to at least two light-triggered type semiconductor devices,
    wherein an optical fiber insertion groove, which corresponds in position to the groove provided on the housing of the light-triggered type semiconductor device, is provided on a side surface of the device cooling heat sink, and formed in the thick wall part of the device cooling heat sink without intersecting the flow path, and
    wherein the L-shaped metal pipe is insertable in a hole defined by the optical fiber insertion groove and the groove provided on the housing after the light-triggered type semiconductor devices and the plurality of device cooling heat sinks are coupled into a single structure.

2. The semiconductor apparatus according to claim 1, wherein the flow path is formed within the device cooling heat sink and is provided along a surrounding part of the optical fiber insertion groove.

3. A method of assembling a semiconductor apparatus, comprising:
    connecting in series a plurality of light-triggered type semiconductor devices, each having a groove for burying of an optical fiber for supplying an optical gate signal to a housing of the light-triggered type semiconductor device;
    disposing device cooling heat sinks, each having a flow path for circulating a coolant medium and a coolant inlet and a coolant outlet communicating with the flow path, on both sides of the housing of each light-triggered type semiconductor device;
    coupling the light-triggered type semiconductor devices and the device cooling heat sinks into a single structure; and
    burying and attaching, thereafter, the optical fiber in the groove formed in the housing, while inserting the optical fiber through an optical fiber insertion groove, the optical fiber insertion groove, which corresponds in position to the groove of the housing, being provided on a side surface of the device cooling heat sink, which contacts a groove-side surface of the housing of the light-triggered type semiconductor device.

* * * * *